(12) United States Patent
De Weerdt (10) Patent No.: US 6,998,737 B2
(45) Date of Patent: Feb. 14, 2006

(54) LITHOGRAPHIC APPARATUS AND DEVICE MANUFACTURING METHOD

(75) Inventor: Robrecht De Weerdt, Hoogstraten (BE)

(73) Assignee: ASML Netherlands B.V., Veldhoven (NL)

( * ) Notice: Subject to any disclaimer, the term of this patent is extended or adjusted under 35 U.S.C. 154(b) by 148 days.

(21) Appl. No.: 10/681,335

(22) Filed: Oct. 9, 2003

(65) Prior Publication Data

US 2005/0077786 A1 Apr. 14, 2005

(51) Int. Cl.
*H02K 41/00* (2006.01)
(52) U.S. Cl. .............. 310/12; 355/53; 355/72
(58) Field of Classification Search .................. 310/12; 355/53, 72
See application file for complete search history.

(56) References Cited

U.S. PATENT DOCUMENTS

| | | | | |
|---|---|---|---|---|
| 5,808,381 A | * | 9/1998 | Aoyama et al. | 310/12 |
| 6,097,114 A | * | 8/2000 | Hazelton | 310/12 |
| 6,268,667 B1 | * | 7/2001 | Denne | 310/12 |
| 6,353,271 B1 | * | 3/2002 | Williams | 310/12 |

* cited by examiner

*Primary Examiner*—Darren Schuberg
*Assistant Examiner*—Judson H. Jones
(74) *Attorney, Agent, or Firm*—Pillsbury Winthrop Shaw Pittman LLP (57) ABSTRACT

A magnetic field distribution for a planar motor is described. The magnetic field distribution can either be generated by means of permanent magnets or one or more current carrying conductor. The planar motor can be applied in a lithographic apparatus for displacing an object table along a first direction and a second direction perpendicular to the first direction. The particular arrangement of permanent magnets or current carrying conductor(s) may result in an improved efficiency of the planar motor in one of said first or second directions.

20 Claims, 9 Drawing Sheets

Fig. 1

PRIOR ART

PRIOR ART

LITHOGRAPHIC APPARATUS AND DEVICE MANUFACTURING METHOD

FIELD

The present invention relates to a lithographic apparatus, particularly a positioning device of a lithography apparatus, and a device manufacturing method, particularly positioning of an object table using a positioning device.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in at one time, and so-called scanners, in which each target portion is irradiated by scanning the pattern through the projection beam in a given direction (the "scanning"-direction) while synchronously scanning the substrate parallel or anti-parallel to this direction.

In a lithographic apparatus, the displacement of objects such as a substrate or a patterning device such as a reticle, are required. Both comparative large displacements in one or two directions and comparative small displacements for accurate positioning are required. Both requirements are often realized by combining a so-called long stroke motor capable of displacing an object over comparatively large distances in one or two directions with a so-called short stroke motor comprising one or more linear actuators, capable of displacing an object with high accuracy over comparatively small distances. Typical values may be that the long stroke motor has a stroke of ~500 mm with micrometer precision while the linear actuator(s) allows a stroke of a few mm with nanometer accuracy. By mounting the short stroke motor on the long stroke motor, an object that is held by an object table connected to said short stroke motor can both be displaced over large distances and accurately positioned. A particular example of such a long stroke motor is a planar motor as described in United States patent U.S. Pat. No. 6,496,093 or United States patent U.S. Pat. No. 6,441,514, incorporated herein in their entirety by reference. A planar motor typically comprises a magnet plate and a coil assembly, one of the plate and assembly being movable relative to the other of the plate and assembly. For example, the planar motor may have a stationary magnet plate and a movable coil block comprising a plurality of coil sets. By applying the appropriate currents to the different coil sets, forces can be generated between the coil block and the magnet plate. Those forces can displace the object table connected to the coil block in a first direction parallel to the plane of the magnet plate, a second direction parallel to the plane of the magnet plate and perpendicular to the first direction and in a third direction perpendicular to said plane. In general, the forces parallel to the plane of the magnet plate are applied to displace the object table distances and/or angles in the horizontal plane (X, Y and Rz) while the forces in a direction perpendicular to said plane are generated to maintain the object table at a predetermined height and inclination (Z, Rx and Ry).

In order to allow displacements in said first direction and said second direction orthogonal to said first direction over comparatively large distances, the magnet plate is designed in such a way that it comprises a periodically alternating magnetic field in those two orthogonal directions. A coil that extends in said first direction and is displaced in said second direction will therefore encounter a periodically alternating flux linkage. When the same coil is rotated 90 degrees i.e. that it extends in said second direction and is displaced in said first direction coil will also encounter a periodically alternating flux linkage. When the coils are provided with a current, a force is generated between the coil and the magnet plate, the force being proportional to the current and to the variation of the flux linkage.

By applying a multi-phase winding and providing the appropriate currents to the different phases, a constant vertical force (in order to compensate for the weight of the object table) and a horizontal force (in order to displace the object table to the required position and/or orientation) can be generated between the magnet plate and the coil block provided with the multi-phase winding. By applying two multi-phase windings displaced orthogonal to each other in said first and second direction, displacements along said first and second direction are made possible. In general, the coil block is equipped with more than two multi-phase windings or coil units. By an appropriate arrangement of the different coil units, the planar motor allows positioning of the object table in up to and including six degrees of freedom. Realizing the required displacements and positioning in up to and including six degrees of freedom is done by providing the appropriate currents to the different coils in the different coil units. As a consequence, dissipation will occur in the different windings.

SUMMARY

An aspect of a lithographic apparatus, that is equally valid for most other processing apparatus, is an aim to optimize the number of objects processed per unit of time, i.e., throughput. One way of increasing throughput is to apply higher accelerations and decelerations (i.e. a higher force requirement) to the object table. However, since the dissipation in the multi-phase windings of the coil units is proportional to the square of the current through the windings, such higher acceleration/deceleration, obtained by applying a higher force, will lead to an increase in dissipation.

Such an increase in dissipation is often not permitted since in many manufacturing processes where accurate positioning of an object is required, dissipation, or thermal contamination, should be kept as low as possible in order to control the temperature of the object. Therefore, the allowed dissipation in the environment of the object to be positioned is restricted by the manufacturing (e.g., lithographic) process itself. Due to this, the dissipation of a planar motor can be a limiting factor with respect to the throughput that can be obtained. Consequently, the overall performance of a lithographic apparatus can be influenced by the performance of the planar motor with respect to dissipation.

Another drawback of planar motors is that the magnetic field distribution of the magnet plates is not optimized with respect to the force requirements in the different degrees of freedom. For example, the magnetic field distribution of planar motors are typically the same in said first and second directions. As a consequence, where identical windings are applied in said first and second directions, the generated force per unit dissipation is the same for both directions. This can result in a non-optimal performance of the planar motor since the requirements with respect to acceleration or duty cycle will, in general, be different in said first and second directions or in the other degrees of freedom. Anticipating this by increasing the size of the coils that generate a force in said first or second directions will lead to a more voluminous and heavier coil block thereby increasing the force needed to obtain a desired acceleration. Since this drawback would imply the use of non-identical coils for the different coil units, the manufacturing costs of the coil block may also increase.

Thus, it would be advantageous to provide a planar motor with an improved performance with respect to generated force vs. dissipation.

According to an aspect of the present invention, there is provided a lithographic apparatus comprising:

an illumination system configured to provide a projection beam of radiation;

a support structure configured to hold a patterning device, the patterning device configured to impart the projection beam with a pattern in its cross-section;

a substrate table configured to hold a substrate;

a projection system configured to project the patterned beam onto a target portion of the substrate; and a positioning device configured to position an object table comprising:

a first part comprising a magnetic field distribution that periodically alternates in a first direction and in a second direction perpendicular to the first direction, wherein the magnetic field distribution is anisotropic with respect to said first and second directions, and a second part comprising a first set of coils arranged relative to the first part to generate a force in at least the first direction and a second set of coils arranged relative to the first part to generate a force in at least the second direction.

An anisotropic magnetic field distribution results in a higher force over dissipation ratio in said first direction compared to the force over dissipation ratio in said second direction, i.e., the positioning device is more efficient for displacements in said first direction than in said second direction. In case the duty cycle or the required acceleration and deceleration in said first direction is more severe than in said second direction, the overall performance of the motor with respect to dissipation will improve. This may result in an improved overall performance of the lithographic apparatus since a reduced dissipation will enable a better thermal stability inside the lithographic apparatus. Alternatively, a higher force over dissipation ratio (i.e. a better efficiency) in said first direction enables an increase in acceleration of the object table in said first direction without an increase in dissipation compared to the situation wherein the efficiency is not improved. Given the fact that in most processes wherein a planar motor is applied the duty cycle in both directions is significantly different, the overall motor performance can be improve significantly either with respect to the number of objects processed per time unit or with respect to the time averaged dissipation of the motor.

To illustrate this, the stationary part of a planar motor can comprises a magnet plate extending in the horizontal plane (further referred to as the XY-plane) while the moving part of the motor comprises four identical coil blocks, each equipped with a three-phase winding. In such an arrangement, maintaining the moving part at a predetermined distance from the stationary part will require a force equal to the weight of the coil blocks plus the object table plus the object. This force is required at a 100% duty cycle. In general, the required accelerations and decelerations in X- and Y-direction will be higher than the gravitational acceleration, the duty cycle however will, in general, be less than 100%. Often, the requirements with respect to the rotational degrees of freedom are merely to maintain the object table in a substantially horizontal position. The force requirements, and consequently the generated dissipation, for maintaining this horizontal position are in general much smaller than the force requirements in the translational degrees of freedom (X, Y, and Z). Therefore, the most important 'sources' of dissipation of the planar motor considered in this example are the realization of the translational forces in X- and Y-directions and the realization of the vertical force for compensation the weight of the coils blocks plus object table plus object. In case the combined force and duty cycle requirement in the Y-direction are more severe than the requirements in X-direction, it will be favorable to position the magnetic field distribution relative to the coil block in such manner that the planar motor has the higher force over dissipation ratio for displacements in the Y-direction.

In an embodiment according to the present invention, the magnetic field distribution is generated by permanent magnets. Different arrangements with different shapes of magnets are described. The magnetic field distribution can be generated using only magnets that are polarized perpendicular to said first and second directions or by combining both magnets that are magnetized perpendicular to said first and second directions and magnets that are magnetized parallel to the plane of the magnetic field distribution. Permanent magnets are widely available in different shapes and sizes and can be processed or shielded in such a way that they can easily be applied in an environment where strict conditions regarding contamination are required.

In another embodiment according to the present invention, the magnetic field distribution is generated by a current carrying conductor. As an example, a conventional conductor such as copper windings or aluminum coils may be applied. Preferably the conductor is at least partly embedded in a ferromagnetic yoke or so-called back-iron in order to increase the flux density. Such an arrangement comprising a ferromagnetic yoke and conventional coil(s) can be easier to assemble than the assembly of a magnet plate comprising of magnetized permanent magnets. A magnet plate comprising of permanent magnets may also be more expensive than an arrangement of one or more conventional conductors embedded in a ferromagnetic yoke.

In a further embodiment, the current carrying conductor generating the magnetic field distribution is made of superconductive wire. The use of a superconductor instead of a conventional conductor has several advantages. First, the magnetic field distribution, which is a time-invariant field, can be generated without dissipation. Second, the magnetic field strength can be several times higher than the field strength generated by permanent magnets. This increased magnetic field strength results in an improved performance of the planar motor either by obtaining the same motor force but with less dissipation or by realizing an increased motor force at the same dissipation level resulting in a larger number of objects processed per time unit.

According to an aspect of the invention, there is provided a device manufacturing method comprising:

positioning an object table using a positioning device, the positioning device comprising:

a first part comprising magnetic field distribution that periodically alternates in a first direction and in a second direction perpendicular to the first direction, wherein the magnetic field distribution is anisotropic with respect to said first and second directions, and a second part comprising a first set of coils arranged relative to the first part to generate a force in at least the first direction and a second set of coils arranged relative to the first part to generate a force in at least the second direction; and projecting a patterned beam of radiation onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2b schematically depicts the flux linkage of a coil displaced along a diagonal of the magnet plate of the planar motor shown in FIG. 2a;

FIG. 2d schematically depicts the Z-component of the flux density along a line-piece that extends along one of the diagonals of the magnet plate as shown in FIG. 2a;

DETAILED DESCRIPTION

Embodiment 1

Figure 1:
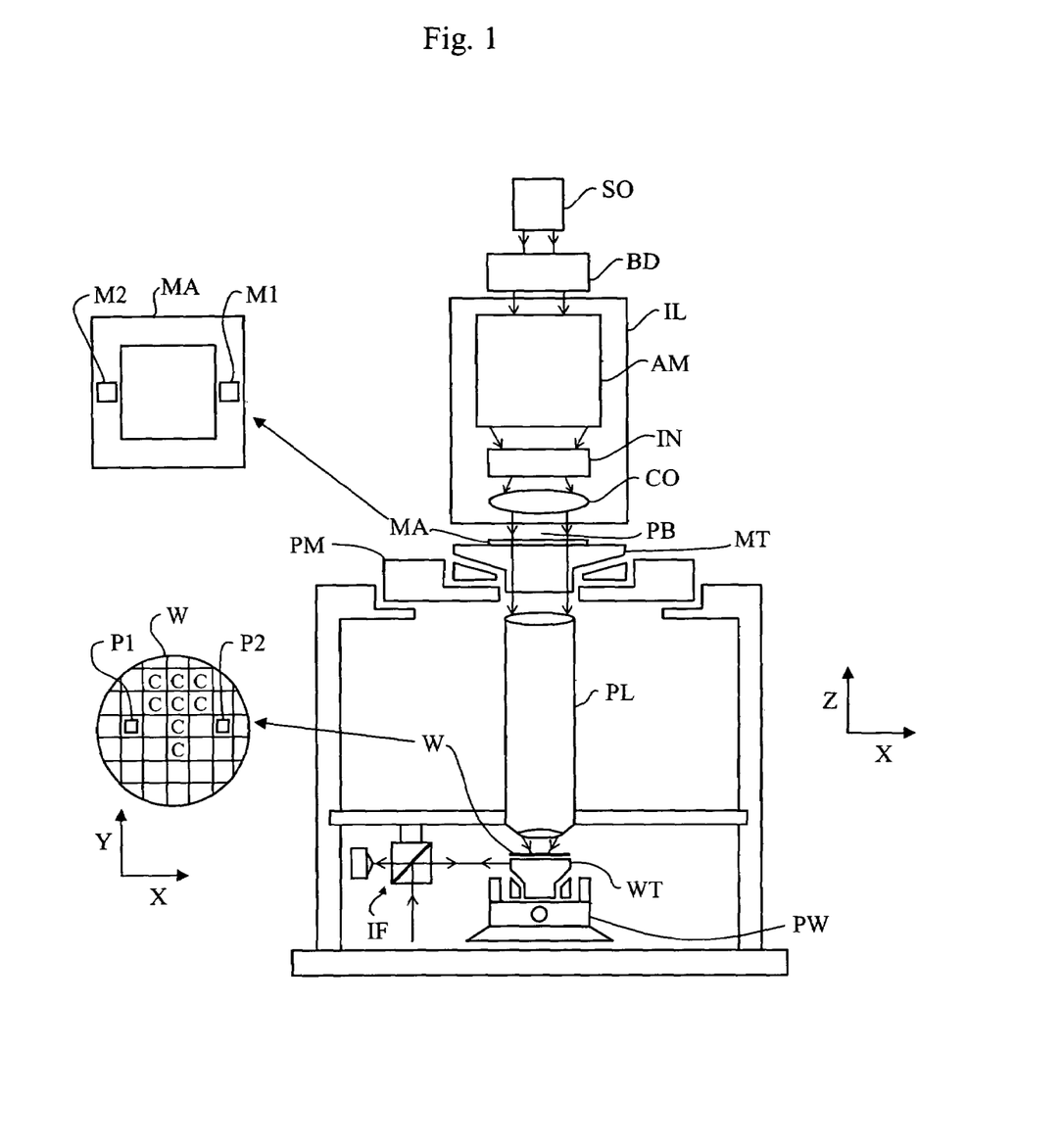
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g. UV radiation or EUV radiation).
- a first support structure (e.g. a mask table) MT for supporting a patterning device (e.g. a mask) MA and connected to first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
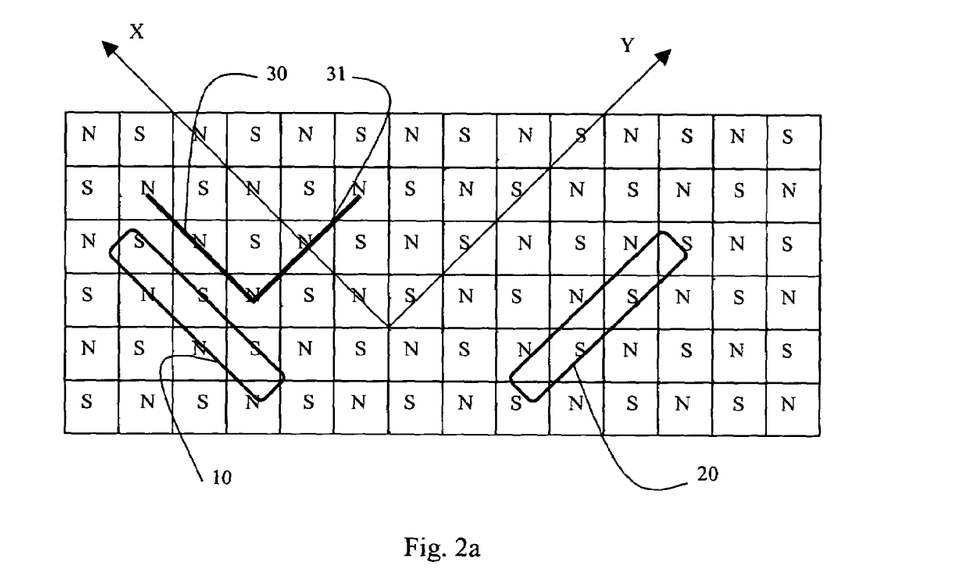
FIG. 2a schematically depicts a magnet plate of a planar motor as known in the art.
Figure 2B:
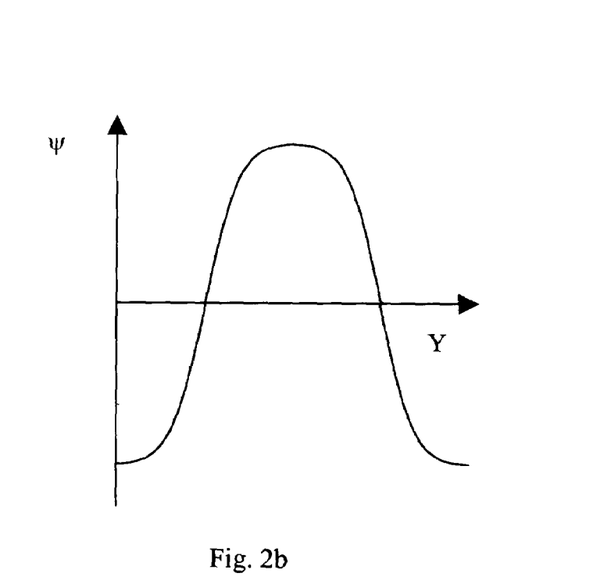
Figure 2C:
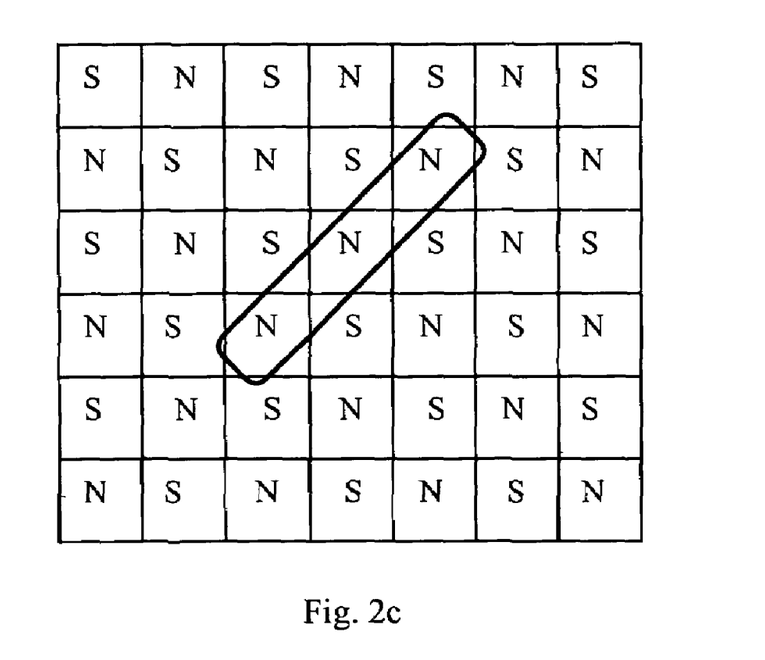
FIG. 2c schematically depicts the position of a coil on the magnet plate of FIG. 2a wherein the magnetic flux linked to the coil is at its maximum.

FIG. 2a schematically depicts a magnet plate for generating a periodically alternating magnetic field distribution in two perpendicular directions as known in the art. The magnetic field is generated by arranging square-shaped magnets in a checkerboard pattern with alternating North and South poles along both rows and columns. Coils that extend along a first diagonal direction X of the checkerboard pattern and are displaced along a second diagonal Y, perpendicular to the first diagonal, such as coil 10, experience a substantially sinusoidally changing flux linkage. The same holds for a coil 20, extending along said second diagonal direction and being displaced along said first diagonal direction. FIG. 2b illustrates the magnetic flux ψ linked to the coil 10 as a function of the displacement in Y-direction. The maximum flux linkage is encountered for a Y-position wherein the ratio of North over South poles covered by the coil is at its maximum. This position is illustrated in FIG. 2c. Where coils 10 and 20 are identical with respect to dimensions and number of turns, the amplitude of the alternating flux linkage will be the same for both coils due to the symmetric distribution of permanent magnets with respect to both X- and Y-directions. Therefore, the force exerted between a current carrying coil and the magnet plate will be the same regardless if the coil is positioned along the first diagonal and displaced along the second or if it is positioned along the second diagonal and displaced along the first. In other words, the magnetic field distribution is isotropic with respect to the first and second directions, i.e. it has the same properties in both directions.

Figure 2D:
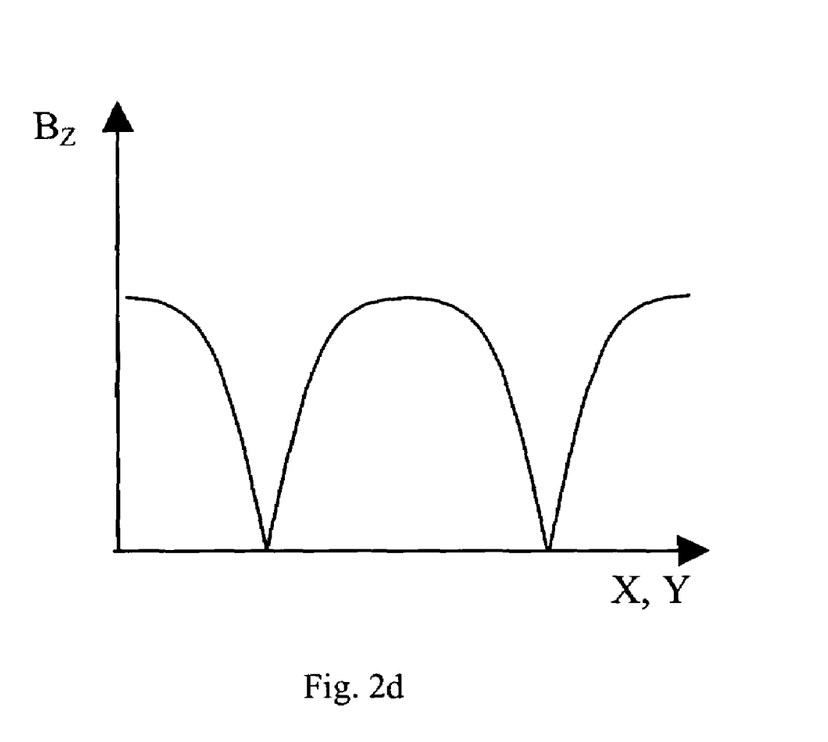

This isotropic feature can also be illustrated by considering the flux density along a line that is either parallel to said first diagonal or to said second diagonal. Line piece 30 (see FIG. 2a) originates from a North pole and extends along the first diagonal direction (the X-direction), line piece 31 originates from the same North pole and extends along the second diagonal direction (Y-direction). FIG. 2d schematically shows the Z-component of the flux density ($B_Z$) along both the line pieces 30 and 31. Due to the isotropic magnetic field distribution along both diagonals, the same flux density pattern with the same amplitude is found along both line pieces.

Figure 3:
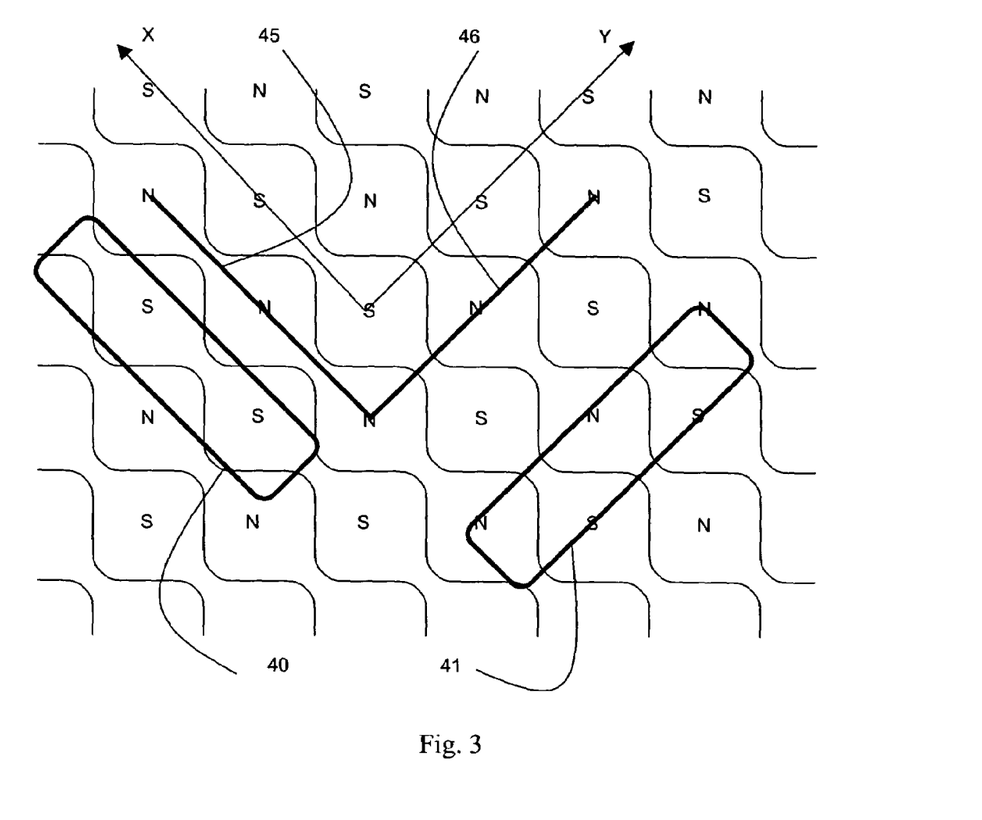
FIG. 3 schematically depicts a two-dimensional magnetic field distribution according to an embodiment of the present invention.

Further, it is clear from FIG. 2d that the average flux density is significantly smaller than the maximum flux density encountered along the line pieces. This is due to the fact that in between two consecutive North poles, the flux density reduces to zero. When a different magnetic field pattern is used, the reduction of the flux density to zero can be avoided and a higher average flux density is realised along one of the diagonals. FIG. 3 schematically depicts a magnetic field pattern that has this property.

The magnetic field pattern shown in FIG. 3 is a two-dimensional alternating magnetic field pattern. Similar to FIG. 2a, two diagonal directions X and Y can be defined. A current carrying coil that extends in the X-direction, such as coil 40, and displaced in the Y-direction, will encounter an alternating force proportional to the variation of the flux linkage of the coil. Similarly, an identical coil carrying the same current but extended in the Y-direction, such as coil 41, and displaced in the X-direction will also encounter an alternating force proportional to the variation of the flux linkage. Due to the particular shape of the two-dimensional periodically alternating magnetic field however, the amplitude of the alternating force encountered by coil 40 will be larger than the amplitude of the alternating force encountered by coil 41. In brief, the interaction between coil 40 and the magnetic field distribution results in a higher force per unit current than the interaction between coil 41 and the magnetic field distribution. This is due to the fact that the variation of the flux linkage of coil 40 is larger than the variation of the flux linkage of coil 41. This is illustrated in FIG. 4, schematically showing the flux linkage of the coils 40 and 41 (the coils are assumed to be identical) when they are displaced along the Y-direction and the X-direction, respectively.

Figure 4:
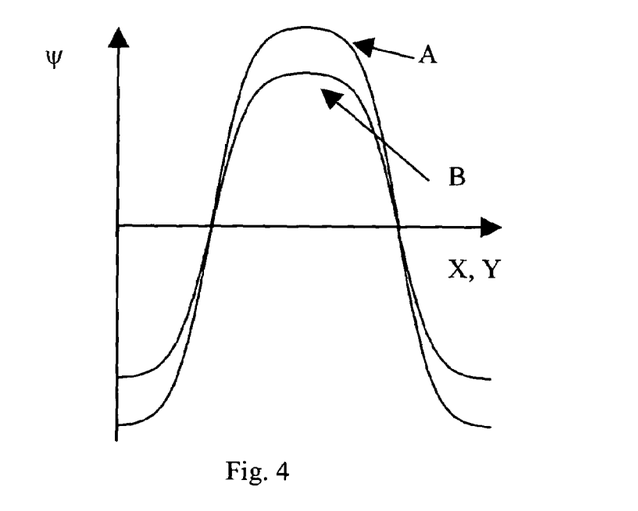
FIG. 4 schematically depicts the flux linkage of two identical coils displaced along a diagonal of the magnetic field distribution as shown in FIG. 3.

Graph A in FIG. 4 corresponds to the flux linkage of coil 40 while graph B corresponds to the flux linkage of coil 41. Since the flux linkage vs. displacement is substantially sinusoidal, the variation of the flux linkage (i.e. the derivative of flux linkage over distance, $d\psi/dx$ or $d\psi/dy$) will also be substantially sinusoidal with an amplitude proportional to the amplitude of the flux linkage. Compared to the magnetic field distribution generated by the magnet plate illustrated in FIG. 2a, the magnetic field distribution in FIG. 3 doesn't have the same properties in both X- and Y-directions i.e. the magnetic field distribution is anisotropic with respect to both directions. The anisotropic properies of the magnetic field pattern as shown in FIG. 3 can also be illustrated by considering the flux density along the two line pieces 45 and 46 that are shown in FIG. 3. Both line pieces originate from the same point i.e. the center of a North pole of the two-dimensional magnetic field distribution, but extend in different directions.

Figure 5:
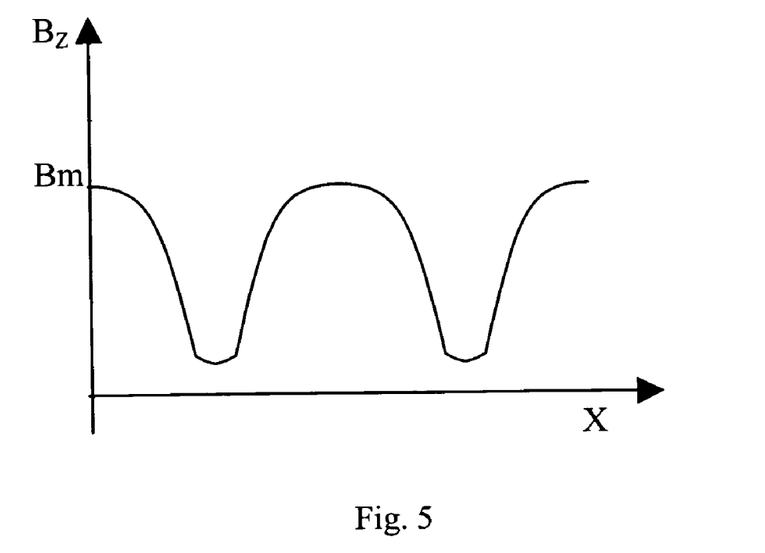
FIG. 5 depicts the magnitude of the flux density along a line-piece that extends along a first diagonal of the magnetic field distribution according to an embodiment of the present invention.
Figure 6:
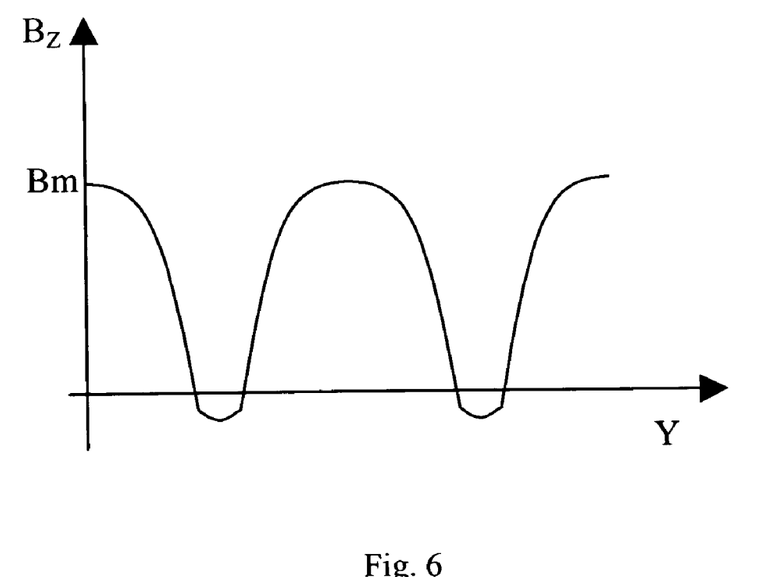
FIG. 6 depicts the magnitude of the flux density along a line-piece that extends along a second diagonal of the magnetic field distribution according to an embodiment of the present invention.

FIG. 5 schematically depicts the Z-component of the flux density ($B_Z$) along the line piece 45 indicated in FIG. 3 that extends in the X-direction while FIG. 6 schematically depicts the Z-component of the flux density ($B_Z$) along the line piece 46 of FIG. 3 that extends in the Y-direction. Comparing FIGS. 5 and 6, it is clear that the average flux density along line piece 45 is larger than the average flux density along line piece 46 illustrating the aforementioned difference in flux linkage.

FIGS. 7a, 7c, 7d, 8, 9 and 10 schematically depict different arrangements to obtain a two-dimensional periodically alternating magnetic field distribution as schematically depicted in FIG. 3.

Figure 7A:
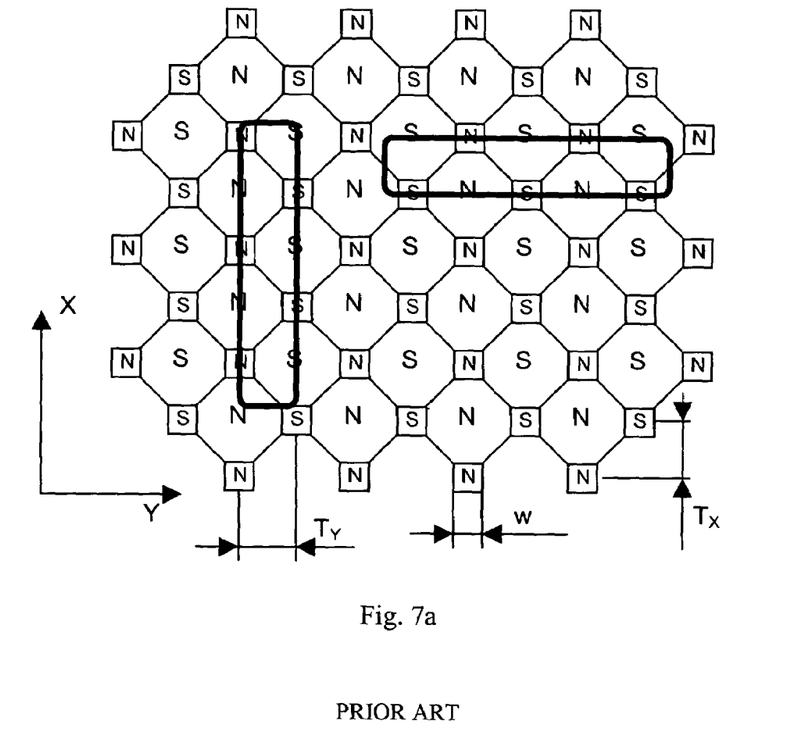
FIG. 7a schematically depicts a first arrangement of permanent magnets resulting in a magnetic field distribution according to an embodiment of the present invention.

FIG. 7a schematically depicts a first example of how such a magnetic field distribution can be realised using permanent magnets that are magnetized in the Z-direction (positive or negative). The pattern is realised by arranging octagonal shaped magnets in a checkerboard pattern and arranging square-shaped magnets in the holes that appear along the diagonals of the checkerboard pattern. The diagonals of the checkerboard pattern correspond to the X- and Y-directions indicated in FIG. 7a. By increasing the size w of the square-shaped magnets, the force per unit current for displacement in the Y-direction can be increased and the force per unit current for displacement in the X-direction is decreased. Where the size w is increased until it equals the magnet pitch $T_Y$, the force-constant for displacement in the Y-direction is at its maximum while the force-constant for displacement in the X-direction is reduced to zero. Note that, as indicated in FIG. 7a, the magnetic pitch is the same for both X- and Y-directions ($T_X = T_Y$) although this is not a requirement for operation of the motor. Further, the shape of the coils shown in the figures is merely illustrative; the actual coils may have a different length, width or shape.

Figure 7B:
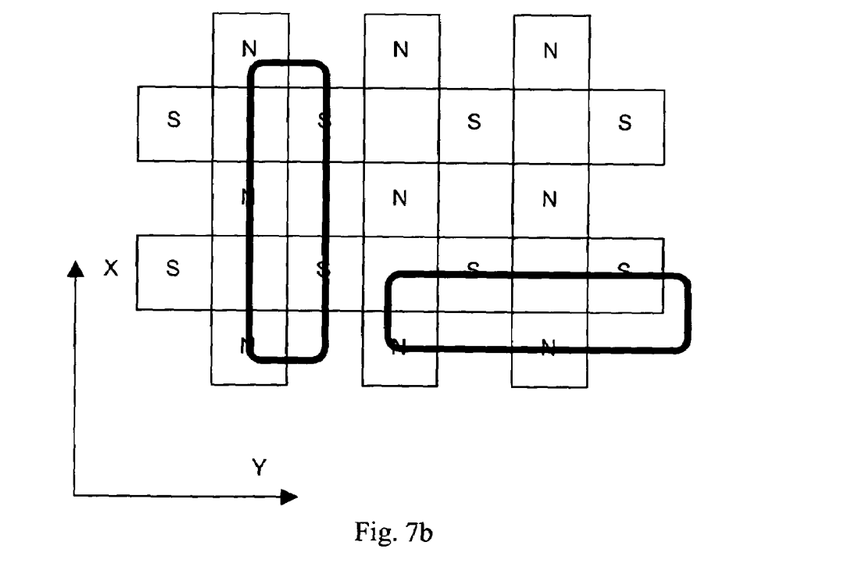
FIG. 7b schematically depicts a permanent magnet distribution as known in the art.
Figure 7C:
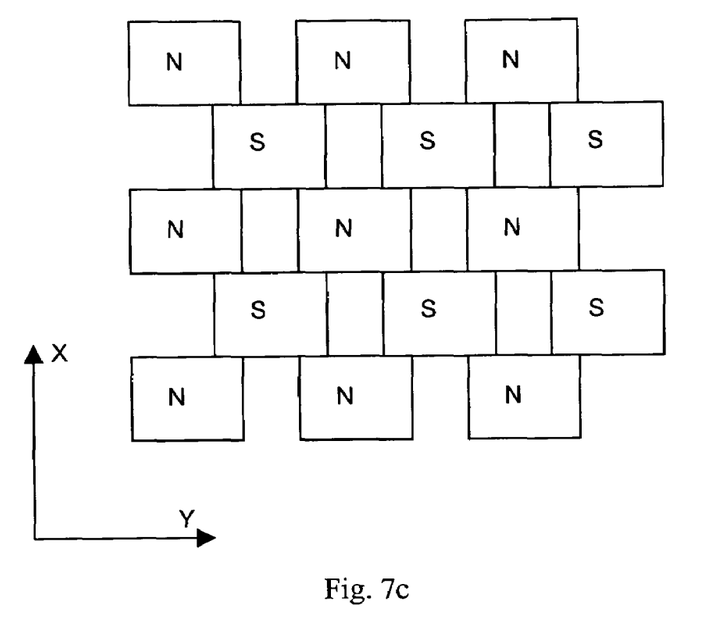
FIG. 7c schematically depicts second arrangement of permanent magnets resulting in a magnetic field distribution according to an embodiment of the present invention.
Figure 7D:
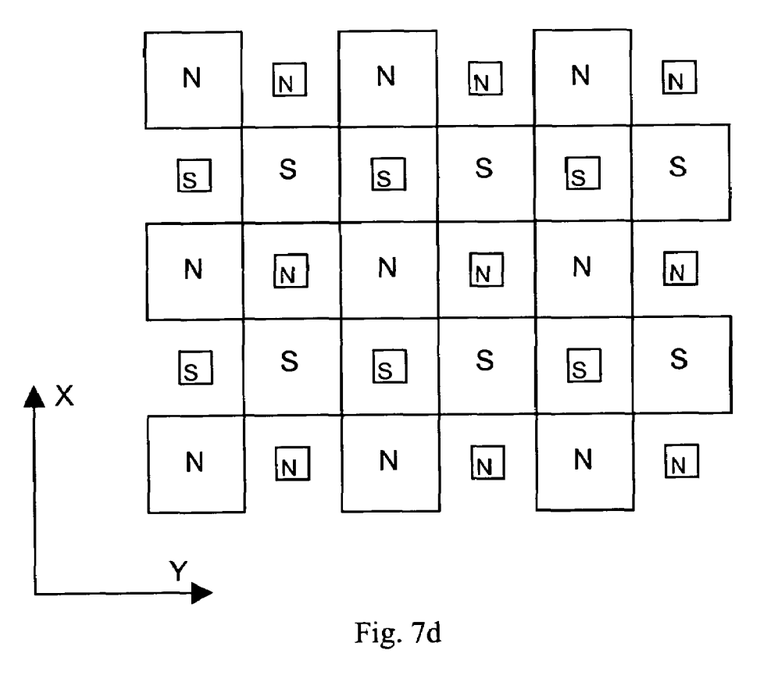
FIG. 7d schematically depicts third arrangement of permanent magnets resulting in a magnetic field distribution according to an embodiment of the present invention.

FIG. 7b schematically depicts another example of a magnet plate as known in the art. The two orthogonal directions along which a force can be generated are indicated as X- and Y-directions. Two coils are also shown. In this arrangement, the directions along which a force can be generated coincide with the rows and columns of the magnet pattern. A drawback of this magnet arrangement is that the magnet plate has a low fill factor, i.e., the ratio of area covered by magnets over the total area is only 50%. FIGS. 7c and 7d show examples of how this magnet plate can be improved to realize an anisotropic magnetic field distribution.

FIG. 7c shows an arrangement of a magnet plate wherein rectangular magnets are used instead of square magnets. The arrangement shown in FIG. 7c provides an improved efficiency for displacements in the X-direction. This arrangement compared to that of FIG. 7b does not alter the magnetic pitch in either the X- or Y-direction. FIG. 7d shows an arrangement wherein square magnets are used to partly fill the gaps between the square magnets of the arrangement of FIG. 7b. Also, in this arrangement, the modification provides an improved efficiency in the X-direction. Both modified arrangements of FIGS. 7c and 7d result in an increased fill factor of the magnet plate.

Figure 8:
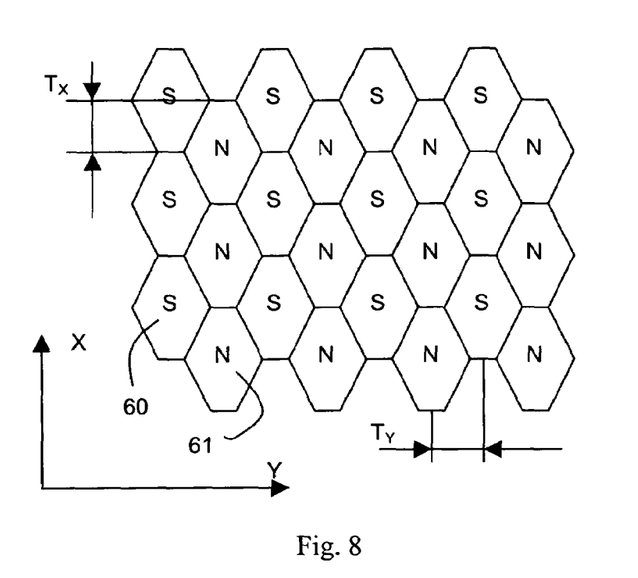
FIG. 8 schematically depicts a fourth arrangement of permanent magnets resulting in a magnetic field distribution according to an embodiment of the present invention.

FIG. 8 shows another magnet arrangement resulting in an anisotropic magnetic field distribution. The magnetic field distribution of FIG. 8 comprises an alternating pattern of hexagonal shaped magnets such as magnets 60,61 magnetized in the Z-direction (positive or negative). An advantage of this arrangement is that only one shape of magnets is required. Further, the magnetic pitch is the same for both X- and Y-directions ($T_x=T_y$) although this is not a requirement for operation of the motor.

Figure 9:
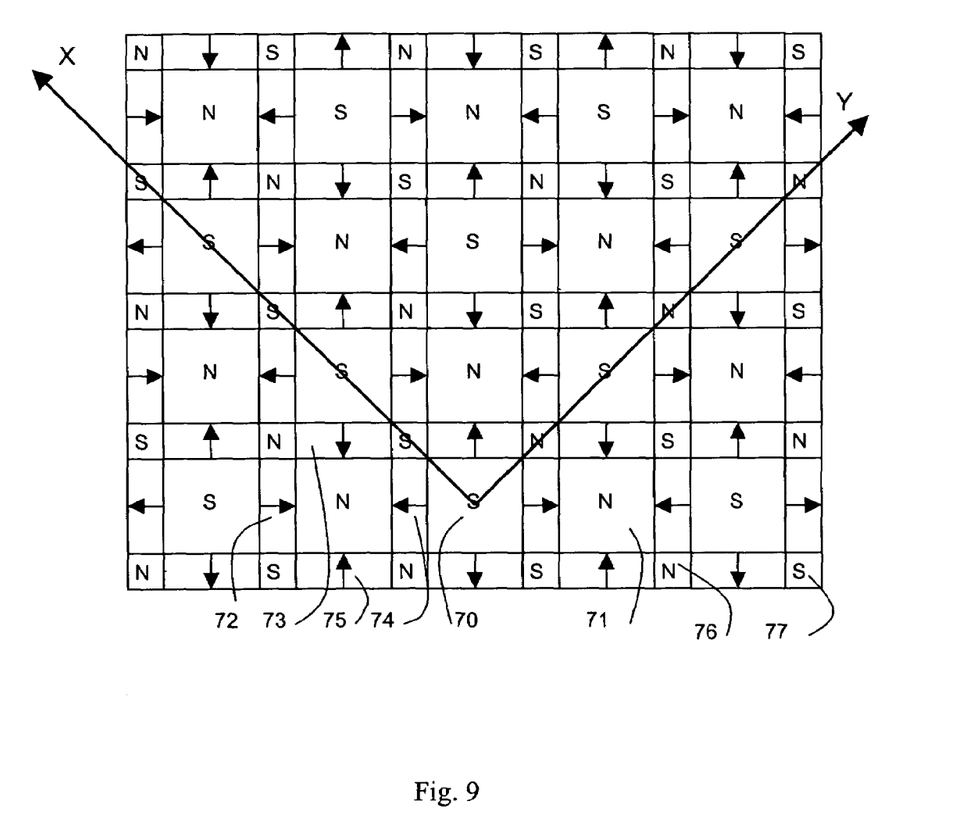
FIG. 9 schematically depicts a fifth arrangement of permanent magnets resulting in a magnetic field distribution according to an embodiment of the present invention.

FIG. 9 shows yet another possible arrangement of permanent magnets to obtain an anisotropic magnetic field distribution resulting in a force per unit dissipation along a first direction that is different to a force per unit dissipation along a second direction perpendicular to the first direction. The magnet pattern schematically shown in FIG. 9 comprises square-shaped magnets that are magnetized in the Z-direction and rectangular magnets that are magnetized perpendicular to that direction. The larger square-shaped magnets 70,71 together with the magnets that are magnetized perpendicular to the Z-direction 72,73,74,75 form a so-called two-dimensional Halbach array. A Halbach array can be used to increase the flux density on one side of the magnet plate and by doing so increase the efficiency of the planar motor. The gaps remaining between the magnets of the two-dimensional Halbach array are filled with smaller square-shaped magnets 76,77. The introduction of the magnets 76,77 results in an anisotropic magnetic field distribution. This distribution results in a force over dissipation ratio that is higher for displacements in the Y-direction than for displacements in the X-direction.

Figure 10:
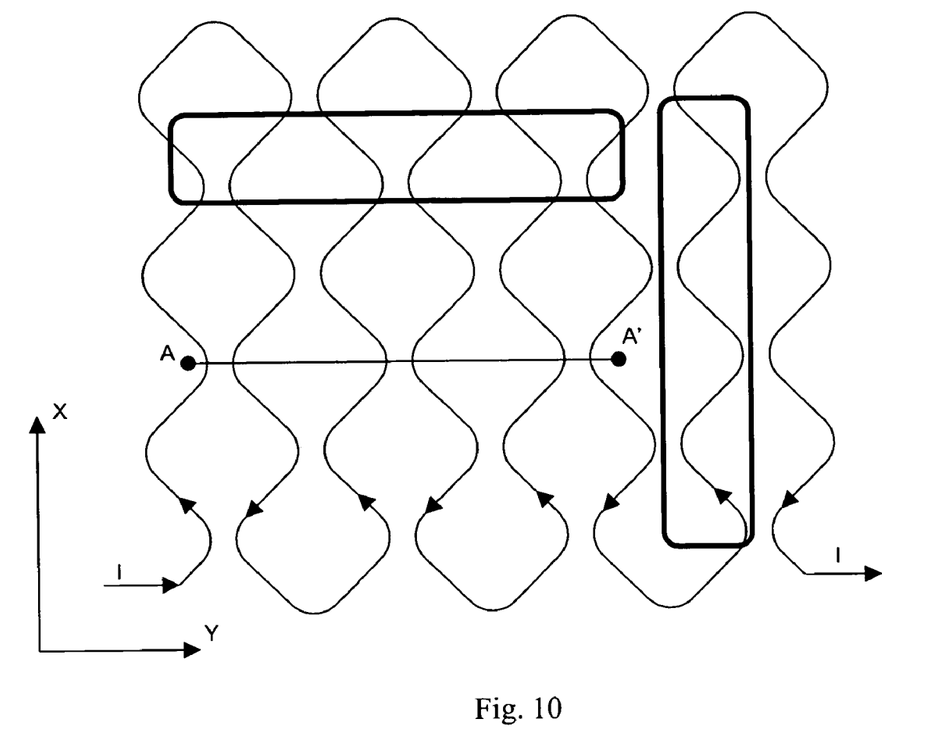
FIG. 10 schematically depicts an arrangement of current carrying conductors resulting in a magnetic field distribution according to an embodiment of the present invention.

The two-dimensional magnetic field distribution as schematically depicted in FIG. 3 can also be realised by using current carrying conductors instead of permanent magnets. FIG. 10 shows such a possible arrangement. In this arrangement, the magnetic field distribution is generated using a single winding. When the winding is equipped with a DC-current, the two-dimensional magnetic field pattern is generated. It will be appreciated that the single winding may comprise different turns that may be connected in parallel or in series. In this way, the requirements with respect to voltage and current can be adapted to match with available DC power sources. It will further be appreciated that the magnetic field distribution may also be generated by multiple concentric windings or multi-layer windings; this may result in a more sinusoidal flux linkage for the different coils in the different coil units.

Figure 11:
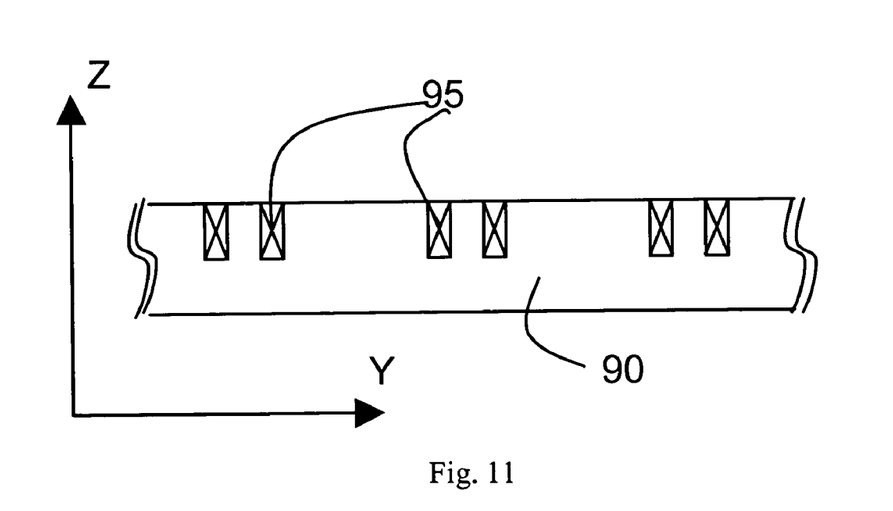
FIG. 11 schematically depicts a cross-sectional view of an arrangement of current carrying conductors resulting in a magnetic field distribution according to an embodiment of the present invention.

In a further embodiment, the current carrying conductor is at least partly embedded in ferromagnetic material in order to increase the generated flux density per unit current. A possible arrangement of such a partly embedded conductor is shown in FIG. 11. FIG. 11 shows a cross-section of the magnet plate along the line-piece A–A' indicated in FIG. 10, including the ferromagnetic plate 90 wherein the current carrying conductors 95 are embedded.

In another embodiment, the current carrying conductor is made of superconductive wire. The superconductor may be embedded in a ferromagnetic plate similar to the embodiment of FIG. 11 although this is not required. Due to the superconductive properties of the winding, a strong magnetic field strength can be generated without embedding the superconductor. The magnetic field strength generated with the superconducting wire can be several times higher than the field generated by permanent magnets.

While specific embodiments of the invention have been described above, it will be appreciated that the invention may be practiced otherwise than as described. For example, the present invention can be applied to any planar motor application wherein a difference in duty cycle and/or force requirement is encountered in the different degrees of freedom. The description is not intended to limit the invention. As an example, a magnet plate having the magnetic field distribution as described herein can be applied in planar motors operating in a horizontal plane but also in planar motors operating in any non-horizontal plane. A planar motor having a magnetic field distribution as described herein can also be operated in combination with a bearing such as, for example, a ball bearing or an air bearing. Such alternatives may be considered if the environmental conditions around the object table allow for such a bearing. In such applications, the planar motor no longer has to provide the force to maintain both moving parts at a predefined distance from each other. This results in a lower dissipation in the motor. Either a first part of the planar motor (i.e. the part comprising the magnetic field distribution) may be attached to the object table or a second part comprising the coil units may be attached to the object table. In general, the planar motor part that is not attached to the object table to be displaced can, as an example, be mounted on either a base frame, a frame isolated from the base frame or a balance mass. This can either be a free mounted balance mass, e.g. a balance mass supported on air bearing that is free to move in the horizontal plane, or a balance mass that is to some extend elastically coupled to the base frame.

Further, the use of a planar motor according to an embodiment of the present invention is not limited to applications that require large displacements in two directions. It can also be applied in applications where only large displacements in one direction are required. A typical example is the displacement of the reticle stage in a lithographic apparatus. In this example, only long stroke movements in a first direction are required while the displacements in a direction perpendicular to this direction are only a fraction of the displacements in the first direction. The planar motor according to an embodiment of the present invention can be applied for this application thereby improving the efficiency and throughput of the apparatus. In such applications, the planar motor can also provide the required bearing force, so no additional bearing such as an air bearing is required. The application can therefore advantageously be used in vacuum as well. In case the displacements in the direction perpendicular to the first direction are small compared to the magnet pitch in said direction, the coil units for generating force in said direction may comprise only a single coil instead of a multi-phase winding.

In general, the magnetic field distribution of a planar motor according to an embodiment of the present invention may be applied in combination with different types of windings. The following examples are merely illustrative and are not intended to limit the invention: the coils in the different coil units in the coil block may comprise multi-layer windings that are overlapping to some extent, the windings may be two- or three phase windings, wherein each winding is powered by its own amplifier or one multi-phase amplifier powering the two- or three phase winding, the coil unit may comprise conventional so-called race-track coils that are positioned next to each other, etc.

What is claimed is:

1. A lithographic apparatus comprising:
   an illumination system configured to provide a projection beam of radiation;
   a support structure configured to hold a patterning device, the patterning device configured to impart the projection beam with a pattern in its cross-section;
   a substrate table configured to hold a substrate;
   a projection system configured to project the patterned beam onto a target portion of the substrate; and
   a positioning device configured to position an object table comprising:
   a first part comprising a magnetic field distribution that periodically alternates in a first direction and in a second direction perpendicular to the first direction, wherein the magnetic field distribution is anisotropic with respect to said first and second directions, and
   a second part comprising a first set of coils arranged relative to the first part to generate a force in at least the first direction and a second set of coils arranged relative to the first part to generate a force in at least the second direction.

2. A lithographic apparatus according to claim 1, wherein the magnetic field distribution is generated by permanent magnets.

3. A lithographic apparatus according to claim 2, wherein said permanent magnets have substantially the same shape.

4. A lithographic apparatus according to claim 1, wherein said magnetic field distribution is generated by an alternating arrangement of octagonal shaped magnets and square shaped magnets in said first and second directions wherein the magnets along said first direction have the same polarity while the magnets along said second direction have an alternating polarity.

5. A lithographic apparatus according to claim 1, wherein said magnetic field distribution is generated by an arrangement of rectangular shaped magnets in said first and second directions, wherein the magnets along said first direction have a same first polarity and the magnets along said second direction have a same second polarity, the first polarity being the same as or different than the second polarity.

6. A lithographic apparatus according to claim 1, wherein said magnetic field distribution is generated by an alternating arrangement of magnets of a first type and of a second type in said first and second directions, wherein the magnets along said first direction have alternating polarity, the magnets along said second direction have the same polarity, and the magnets of the first type are a different size than the magnets of the second type.

7. A lithographic apparatus according to claim 1, wherein said magnetic field distribution is generated by an arrangement of hexagonal shaped magnets in said first and second directions.

8. A lithographic apparatus according to claim 7, wherein the magnetic pitch of the magnets is the same for both first and second directions.

9. A lithographic apparatus according to claim 1, wherein the magnetic field distribution is generated by a two-dimensional Halbach array of magnets, extending in the first and second directions, having gaps between the magnets, wherein the gaps between magnets of the Halbach array comprise square shaped magnets, the square shaped magnets along said first direction have a same first polarity and the magnets along said second direction have a same second polarity, the first polarity being the same as or different than the second polarity.

10. A lithographic apparatus according to claim 1, wherein the magnetic field distribution is generated by at least one current carrying conductor.

11. A lithographic apparatus according to claim 10, wherein said at least one current carrying conductor is at least partly embedded in a ferromagnetic plate.

12. A lithographic apparatus according to claim 10, wherein said at least one current carrying conductor is a superconductor.

13. A device manufacturing method comprising:
    positioning an object table using a positioning device, the positioning device comprising:
    a first part comprising a magnetic field distribution that periodically alternates in a first direction and in a second direction perpendicular to the first direction, wherein the magnetic field distribution is anisotropic with respect to said first and second directions, and
    a second part comprising a first set of coils arranged relative to the first part to generate a force in at least the first direction and a second set of coils arranged relative to the first part to generate a force in at least the second direction; and
    projecting a patterned beam of radiation onto a target portion of a substrate.

14. The method according to claim 13, wherein said magnetic field distribution is generated by an alternating arrangement of octagonal shaped magnets and square shaped magnets in said first and second directions wherein the magnets along said first direction have the same polarity while the magnets along said second direction have an alternating polarity.

15. The method according to claim 13, wherein said magnetic field distribution is generated by an arrangement of rectangular shaped magnets in said first and second directions, wherein the magnets along said first direction have a same first polarity and the magnets along said second direction have a same second polarity, the first polarity being the same as or different than the second polarity.

16. The method according to claim 13, wherein said magnetic field distribution is generated by an alternating arrangement of magnets of a first type and of a second type in said first and second directions, wherein the magnets along said first direction have alternating polarity, the magnets along said second direction have the same polarity, and the magnets of the first type are a different size than the magnets of the second type.

17. The method according to claim 13, wherein said magnetic field distribution is generated by an arrangement of hexagonal shaped magnets in said first and second directions.

18. The method according to claim 13, wherein the magnetic field distribution is generated by a two-dimensional Halbach array of magnets, extending in the first and second directions, having gaps between the magnets, wherein the gaps between magnets of the Halbach array comprise square shaped magnets, the square shaped magnets along said first direction have a same first polarity and the magnets along said second direction have a same second polarity, the first polarity being the same as or different than the second polarity.

19. The method according to claim 13, wherein the magnetic field distribution is generated by at least one current carrying conductor.

20. The method according to claim 19, wherein said at least one current carrying conductor is at least partly embedded in a ferromagnetic plate.

* * * * *